United States Patent
Huang et al.

(10) Patent No.: US 6,355,546 B1
(45) Date of Patent: Mar. 12, 2002

(54) THERMALLY GROWN PROTECTIVE OXIDE BUFFER LAYER FOR ARC REMOVAL

(75) Inventors: Richard J. Huang; Lewis Shen, both of Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/371,922

(22) Filed: Aug. 11, 1999

(51) Int. Cl.[7] .......................................... H01L 21/3205
(52) U.S. Cl. ...................... 438/585; 438/584; 438/258; 438/259; 257/202
(58) Field of Search ................................. 438/585, 231, 438/260, 709, 636; 216/51; 437/186

(56) References Cited

U.S. PATENT DOCUMENTS

| | | | | |
|---|---|---|---|---|
| 5,639,687 A | * | 6/1997 | Roman et al. | 437/186 |
| 5,677,231 A | * | 10/1997 | Maniar et al. | 437/67 |
| 5,733,712 A | * | 3/1998 | Tanaka et al. | 430/314 |
| 5,891,784 A | * | 4/1999 | Cheung et al. | 438/303 |
| 5,918,147 A | * | 6/1999 | Filipiak et al. | 438/636 |
| 6,030,541 A | * | 2/2000 | Adkisson et al. | 216/51 |
| 6,049,093 A | * | 4/2000 | Manning et al. | 257/67 |
| 6,083,852 A | * | 7/2000 | Cheung et al. | 438/791 |
| 6,090,653 A | * | 7/2000 | Wu | 438/231 |
| 6,090,722 A | * | 7/2000 | Armacost et al. | 438/763 |
| 6,097,090 A | * | 8/2000 | Tran et al. | 257/750 |
| 6,117,731 A | * | 9/2000 | Wu | 438/260 |
| 6,124,212 A | * | 9/2000 | Fan et al. | 438/709 |
| 6,136,636 A | * | 10/2000 | Wu | 438/231 |

OTHER PUBLICATIONS

Wolf, S. Silicon Processing for the VLSA Era, vol. 1, Lattice Press, Sunset Beach Ca., p. 200.*

* cited by examiner

*Primary Examiner*—John F. Niebling
*Assistant Examiner*—Olivia T Luk

(57) ABSTRACT

A thermally grown oxide buffer layer is formed on a silicon layer prior to depositing an ARC thereon, thereby preventing damage to the silicon layer during ARC removal. Embodiments include thermally growing a silicon oxide buffer layer on an amorphous or polycrystalline silicon layer by thermal oxidation at a temperature of about 800° C. to about 900° C. in an atmosphere comprising oxygen or steam. A silicon oxynitride or silicon-rich silicon nitride ARC is then formed on the thermally grown protective silicon oxide buffer layer and a photoresist layer is formed on the ARC. The photoresist layer is patterned to form a mask and the underlying silicon layer etched to form a conductive feature, e.g., gate electrode. The photoresist mask is then removed and the ARC is stripped with hot phosphoric acid or by dry etching, while the thermally grown silicon oxide buffer layer protects the underlying silicon layer from damage.

19 Claims, 2 Drawing Sheets

THERMALLY GROWN PROTECTIVE OXIDE BUFFER LAYER FOR ARC REMOVAL

RELATED APPLICATIONS

This application contains subject matter similar to subject matter disclosed in copending U.S. patent application Ser. No. 09/371,924 filed on Aug. 11,1999, the entire disclosure of which is incorporated by reference herein.

TECHNICAL FIELD

The present invention relates to a method of manufacturing a semiconductor device having sub-micron features. The present invention has particular applicability in manufacturing semiconductor devices with a design rule of about 0.18 micron and under with accurately dimensioned condutive features.

BACKGROUND ART

The escalating requirements for high density and performance associated with ultra large scale integration require responsive changes in electrical interconnect patterns, which is considered one of the most demanding aspects of ultra-large scale integration technology. Demands for ultra-large scale integration semiconductor wiring require increasingly denser arrays with minimal spacing between conductive lines. Implementation becomes problematic in manufacturing semiconductor devices having a design rule of about 0.18 micron and under, e.g., about 0.15 micron and under.

Semiconductor devices typically comprise a substrate and elements, such as transistors and/or memory cells, thereon. Various interconnection layers are formed on the semiconductor substrate to electrically connect these elements to each other and to external circuits. The formation of gate electrodes and interconnection lines is partly accomplished utilizing conventional photolithographic techniques to form a photoresist mask comprising a pattern and transferring the pattern to an underlying layer or composite by etching the exposed underlying regions.

In accordance with conventional practices, an anti-reflective coating (ARC) is typically provided between the photoresist layer and an underlying silicon layer to avoid deleterious reflections from the underlying silicon layer during patterning of the photoresist layer. ARCs are chosen for their optical properties and compatibility with the underlying silicon layer and typically include a silicon oxynitride, silicon-rich silicon nitride or titanium nitride. Conventional deep-ultraviolet (deep-UV) photoresist processing typically involves exposure to deep-tV radiation having a wavelength of about 100 nm to about 300 nm.

As miniaturization proceeds apace with an attendant shrinkage in size of individual semiconductor devices and crowding more devices into any given unit area, problems arise with respect to maintaining the accuracy of the dimensions of various features, notably polycrystalline silicon gate electrodes. During conventional processing, the ARC is deposited on an amorphous silicon (subsequently crystallized during processing) or polycrystalline silicon layer and a photomask formed on the ARC. In forming a conductive feature, e.g., gate electrode, the integrity of the ARC is deteriorated by virtue of various processing steps. For example, during ion implantation, the uniformity of its etchability is alternated. Moreover the integrity of the ARC is deteriorated during stripping of resist with a solvent. As a result, during conventional stripping of the ARC, as with hot phosphoric acid or by dry etching employing $CF_4$ and $O_2$ chemistry, the underlying silicon layer is damaged, as by pitting.

Conventional methodology for forming a gate electrode is schematically illustrated in FIGS. 1A and 1B, wherein similar features are denoted by similar reference numerals. Adverting to FIG. 1A, amorphous or polycrystalline silicon gate electrode layer 12 is formed on gate dielectric layer 11 overlying substrate 10, and ARC 13 is formed on gate electrode 12. As a result of previous processing, including ion implantation and stripping of the photoresist mask, the integrity of ARC 13 has been damaged in that it does not exhibit a uniform removal rate and exhibits porosity. Consequently, as shown in FIG. 1B, upon stripping ARC 13 in a conventional manner, as by employing hot phosphoric acid or dry etching, the upper surface 14 of a gate electrode 12 is pitted thereby adversely impacting device performance.

There exists a need for methodology enabling patterning of a conductive feature, such as a silicon gate electrode, with improved accuracy and integrity. There exists a further need for such methodology enabling the formation of gate electrodes without surface pitting.

SUMMARY OF THE INVENTION

An advantage of the present invention is a method of manufacturing a semiconductive device having accurately dimensioned conductive features, such as gate electrodes.

Another advantage of the present invention is a method of manufacturing a semicondutive device having gate electrodes with high integrity and without surface pitting.

Additional advantages and features of the present invention will be set forth in part in the description which follows and in part will become apparent to those having ordinary skill in the art upon examination of the following or may be learned from the practice of the invention. The advantages of the present invention may be realized and obtained as particularly pointed out in the appended claims.

According to the present invention, the foregoing and other advantages are achieved in part by a method of manufacturing a semiconductor device, the method comprising: forming a silicon layer; heating to thermally grow a protective oxide layer on the silicon layers; forming an ARC on the protective oxide layer; patterning the silicon layer to form a conductive feature; and removing the ARC.

Embodiments of the present invention include thermally growing a protective silicon oxide layer, at an elevated temperature in an oxidizing atmosphere to a thickness of about 50 Å to about 100 Å, on an upper surface of an amorphous or polycrystalline silicon layer. A silicon oxide nitride or silicon-rich silicon nitride ARC is formed on the protective oxide layer and photolithographic processing is conducted in a conventional manner to pattern the underlying silicon layer, as in forming a gate electrode. Subsequently, ion implantation is conducted to form source/drain regions and the photoresist mask stripped. The ARC is then removed in a conventional manner, as by stripping with hot phosphoric acid or dry etching without damage to the underlying silicon layer by virtue of the protective oxide layer formed thereon.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention.

DESCRIPTION OF THE INVENTION

The present invention addresses and solves problems attending upon conventional methodology in forming conductive features, particularly gate electrodes. Such problems include surface attack by hot phosphoric acid or during dry etching when removing an overlying ARC from a patterned silicon feature. It is believed that such problems stem from deterioration of the ARC during previous processing, e.g., ion implantation and photoresist stripping. The deterioration of the ARC renders the underlying silicon surface susceptible to attack during ARC removal.

The present invention addresses and solves such problems by thermally growing a protective buffer oxide layer on the silicon layer prior to forming the ARC thereon. Thus, a protective oxide buffer layer is interposed between the ARC and the underlying silicon layer prior to patterning. Accordingly, during the removal of the ARC, the underlying silicon layer is protected by the oxide buffer layer.

The oxide buffer layer formed in accordance with the present invention is substantially transparent to UV light and, hence, does not substantially alter the reflectiveness of the surface such that the combined ARC and oxide buffer layer essentially function as an anti-reflective layer to UV light. The oxide buffer layer additionally protects the underlying silicon layer from pitting by hot phosphoric acid or from dry etching when stripping the ARC.

The silicon oxide buffer layer according to embodiments of the present invention is thermally grown to a suitable thickness to perform the disclosed function, e.g., about 50 Å to about 100 Å. The ARC can be deposited at a conventional thickness, e.g., at about 2 Å to about 300 Å, and can comprise a conventional silicon oxide nitride or a silicon-rich silicon nitride ARC material.

The protective oxide buffer layer according to the embodiments of the present invention can be thermally grown at a suitable temperature, e.g., about 800° C. to about 900° C. in suitable atmosphere, such as a dry atmosphere, e.g., an oxygen-containing atmosphere, or a wet atmosphere, e.g., water vapor. The silicon layer can be deposited as an amorphous layer or as a polycrystalline silicon layer. A deposited amorphous layer is subsequently crystallized during processing.

Figure 1A:
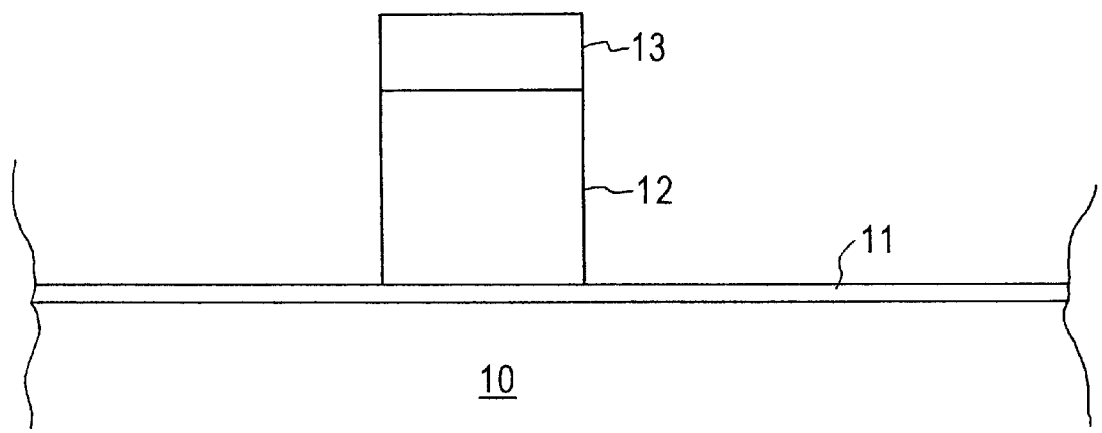
FIGS. 1A and 1B schematically illustrate conventional gate electrode methodology.
Figure 1B:
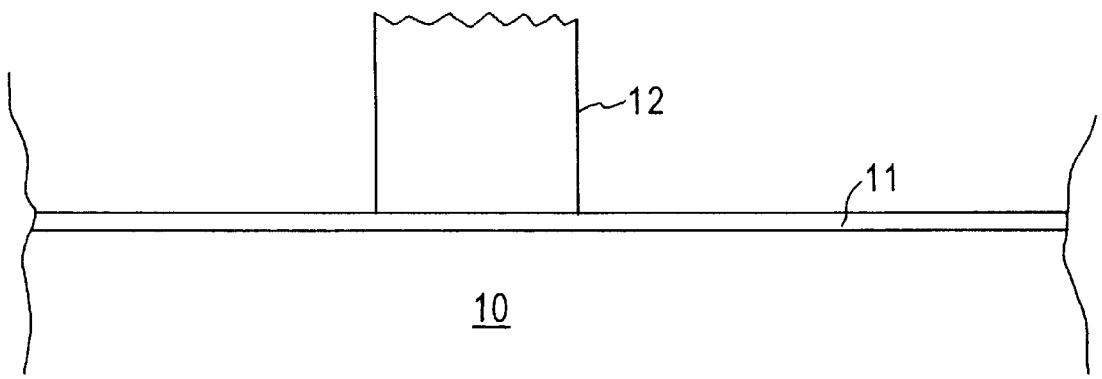
Figure 2A:
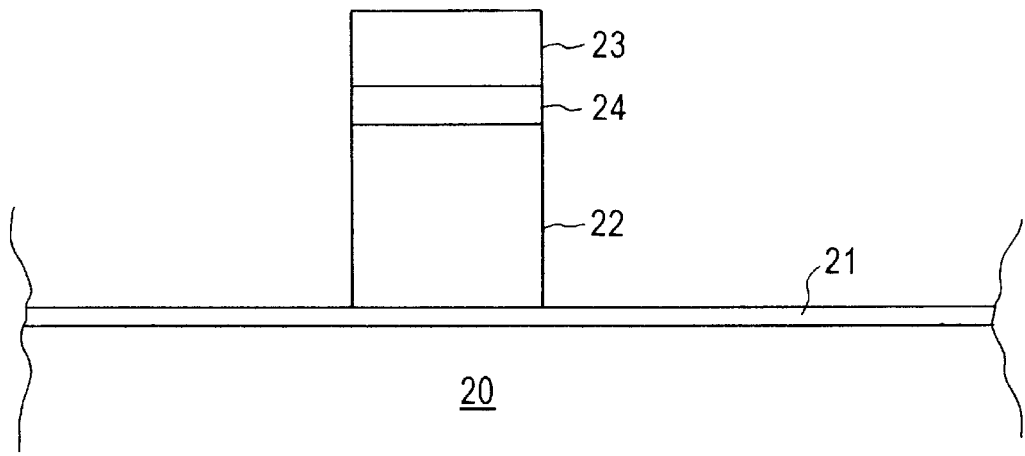
FIGS. 2A–2B schematically illustrate an embodiment of the present invention.
Figure 2B:
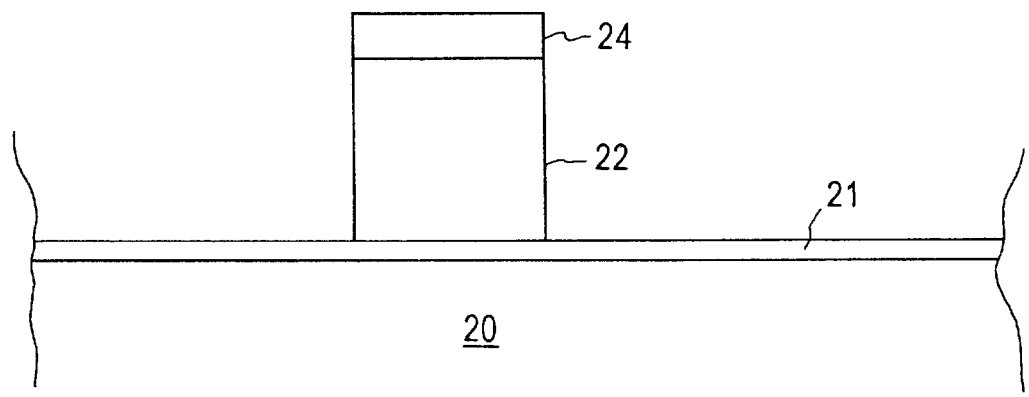

An embodiment of the present invention is schematically illustrated in FIGS. 2A–2B, wherein similar features bear similar reference numerals. Adverting to FIG. 2A, a patterned gate electrode structure is formed comprising gate electrode 22 on gate dielectrode layer 21 overlying substrate 20. Protective oxide layer 24 is thermally grown on gate electrode layer 22 and ARC 23, e.g., a silicon oxynitride or silicon-rich silicon nitride layer, is formed on protective oxide layer 24. Thermally grown protective oxide layer 24 is relatively dense and protects the upper surface of gate electrode 22 during removal of ARC 23, as by stripping with hot phosphoric acid or by dry etching.

The present invention enjoys industrial utility in manufacturing any of various types of semiconductor devices, particularly semiconductor devices having features in the deep sub-micron range, such as about 0.18 micron and under, e.g., about 0.15 micron and under. The present invention advantageously enables manufacturing semiconductor devices having accurately dimensioned conductive features e.g., polycrystalline silicon gate electrodes, with high integrity employing deep UV photoresist technology. The methodology of the present invention advantageously eliminates pitting of the gate electrode surface during ARC removal.

Only the preferred embodiment of the present invention and an example of its versatility is shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising:
    forming a silicon layer;
    heating to thermally grow a protective silicon oxide layer to a thickness of about 50 Å to about 100 Å on the silicon layer;
    forming an anti-reflective coating (ARC) on the protective silicon oxide layer;
    patterning the underlying silicon layer to form a conductive feature; and
    removing the ARC.

2. The method according to claim 1, comprising thermally growing the protective silicon oxide layer to a thickness of about 50 Å to about 100Å.

3. The method according to claim 1, comprising thermally growing the protective silicon oxide layer at a temperature of about 800° C. to about 900° C.

4. The method according to claim 3, comprising thermally growing the protective silicon oxide layer for less than one hour.

5. The method according to claim 3, comprising thermally growing the protective silicon oxide layer in an atmosphere containing water vapor.

6. The method according to claim 1, where the silicon layer comprises amorphous silicon or polycrystalline silicon.

7. The method according to claim 1, where the ARC comprises a silicon oxynitride or a silicon-rich silicon nitride.

8. The method according to claim 7, comprising forming the ARC at a thickness of about 2 Å to about 300Å.

9. The method according to claim 7, comprising stripping the ARC with hot phosphoric acid or by dry etchin.

10. The method according to claim 1, comprising sequentially:
    forming photoresist mask on the ARC:
    etching to pattern the silicon layer; and
    stripping the photoresist mask.

11. The method according to claim 10, comprising patterning the silicon layer to form a gate electrode.

12. A method of manufacturing a semiconductor device, the method comprising sequentially:
    forming a silicon layer;
    heating to thermally grow a protective silicon oxide layer on the silicon layer;
    forming an anti-reflective coating (ARC) on the protective silicon oxide layer;
    forming a photoresist mask on the ARC;
    patterning the underlying silicon layer to form a conductive feature;
    stripping the photoresist mask; and
    removing the ARC.

13. The method according to claim 12, comprising thermally growing the protective silicon oxide layer at a temperature of about 800° C. to about 900° C.

14. The method according to claim 13, comprising thermally growing the protective silicon oxide layer for less than one hour in an atmosphere containing water vapor.

15. The method according to claim 12, where the silicon layer comprises amorphous silicon or polycrystalline silicon.

16. The method according to claim 12, comprising stripping the ARC with hot phosphoric acid or by dry etching.

17. The method according to claim 12, comprising forming the ARC directly on the protective oxide layer.

18. The method according to claim 12, comprising patterning the silicon layer to form a gate electrode.

19. The method according to claim 1, comprising forming the ARC directly on the protective oxide layer.

* * * * *